United States Patent
Gill

(10) Patent No.: US 6,275,689 B1
(45) Date of Patent: Aug. 14, 2001

(54) DOUBLE-BALANCED MIXER

(75) Inventor: Hardial Gill, Backnang (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/354,560

(22) Filed: Jul. 15, 1999

(30) Foreign Application Priority Data

Sep. 2, 1998 (DE) .............................. 198 39 890

(51) Int. Cl.$^7$ ...................................... H04B 1/26
(52) U.S. Cl. ................... 455/326; 455/323; 455/318; 455/319; 455/327; 333/25; 333/116
(58) Field of Search ................... 455/318, 319, 455/323, 327, 333, 326, 330; 333/4, 5, 25, 26, 100, 109, 120, 121, 128, 115, 116, 117; 327/113

(56) References Cited

U.S. PATENT DOCUMENTS

| | | | |
|---|---|---|---|
| 4,697,161 | * 9/1987 | Buoli | 333/116 |
| 5,428,840 | * 6/1995 | Sadhir | 455/326 |
| 5,678,225 | * 10/1997 | Kobayashi | 455/330 |
| 5,774,801 | * 6/1998 | Li et al. | 455/326 |
| 5,854,974 | * 12/1998 | Li | 455/330 |

FOREIGN PATENT DOCUMENTS 34 22 514 C2  12/1992 (DE).

OTHER PUBLICATIONS

;A Monolithic Hybrid Broadband Compensated Balun, by A.M. Pavio et al., 1990 IEEE MTT-S Digest, pp. 483–486.
"Three Balun Designs for Push–Pull Amplifiers", Application Note, TRW, Z99.
Maas S: "A Broadband Planar Monolithic Ring Mixer", IEEE Microwave and Millimeter–Wave Monolithic Circuit Symposium, IEEE pp. 51–52.
"A Novel Planar Double–Balanced 6–18 GHZ MMIC Mixer", by Wayne R. Brinlee, Karl R. Varian, Anthony M. Pavio, IEEE MTT Symposium Digest, 1994, Session TV 1A–s.

* cited by examiner

Primary Examiner—Dwayne Bost
Assistant Examiner—Joy K. Contee
(74) Attorney, Agent, or Firm—Michael J. Striker

(57) ABSTRACT

The double-balanced mixer includes a diode ring (D1, D2, D3, D4) with respective balancing circuit portions for a local oscillator signal (LO) and a high frequency signal (RF) and a capacitively-loaded conductor branch (L3,L4) for an intermediate frequency signal (IF). In order to minimize conversion losses and obtain a high isolation between the local oscillator signal (LO) and the high frequency signal (RF), each balancing circuit portion comprises a first coupler including two strip lines (L11, L12; L31, L32) and a second coupler constructed as an interdigital coupler (L21, L22, L23, L24; L41, L42, L43, L44). The first coupler (L11, L12; L31, L32) of each balancing circuit portion is connected to a respective first symmetric input (1,3) of the diode ring and the second coupler is connected with a respective second symmetric input of the diode ring. Both couplers are connected with each other via one of their gates (14,24; 34,44). Two other gates (12,13; 32,33) of each first coupler (L11, L12; L31, L32) form asymmetric inputs for either the local oscillator signal (LO) or the high frequency signal (RF).

12 Claims, 1 Drawing Sheet

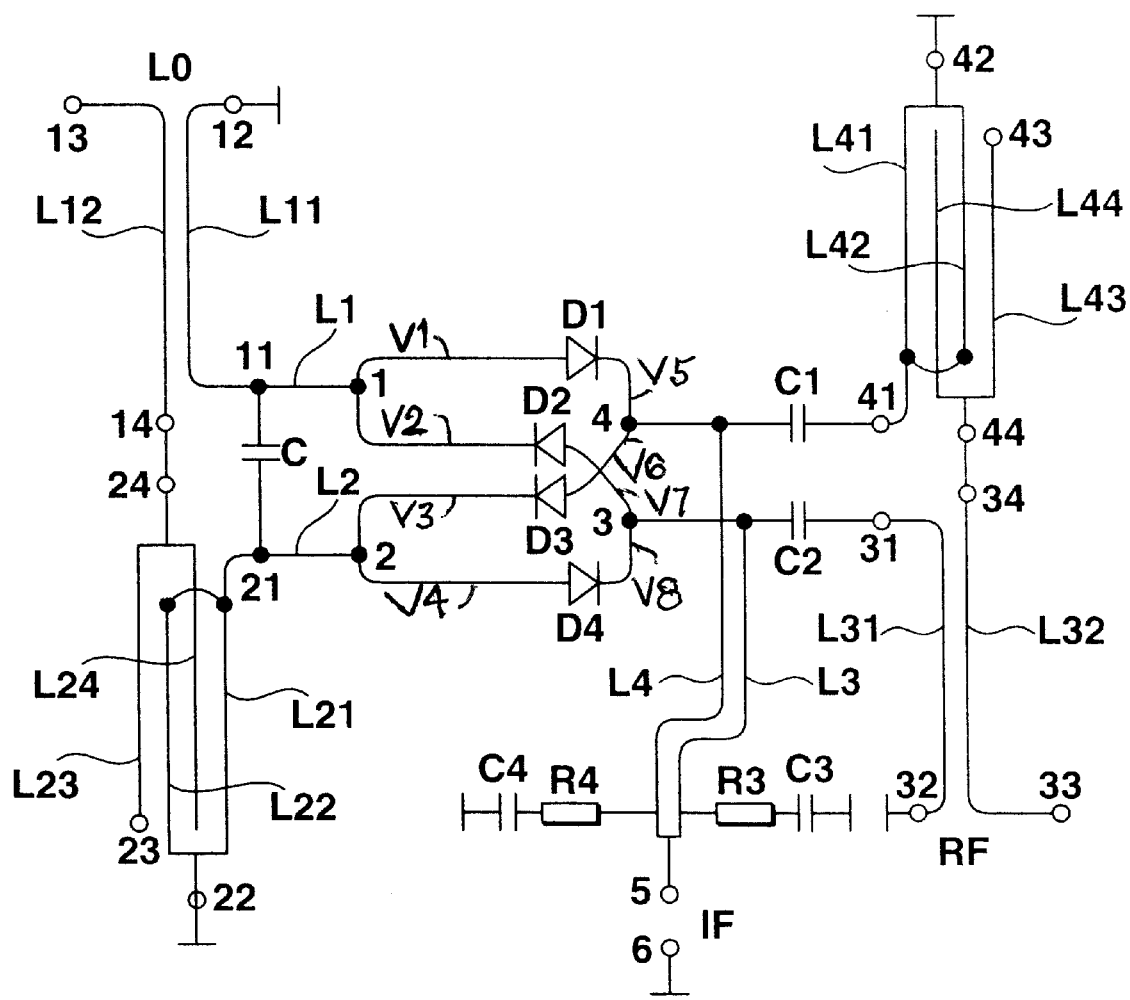

DOUBLE-BALANCED MIXER

BACKGROUND OF THE INVENTION

1. Field of the Invention

The present invention relates to a double-balanced mixer comprising a diode ring which is connected with respective balancing circuit portions for a local oscillator signal and for a high frequency signal and with a capacitively-loaded conductor branch for an intermediate frequency signal.

2. Prior Art

A double-balanced mixer of this type is disclosed in the article by W. Brinlee, K. Varian and M. Pavio, entitled "A Novel Planar Double-Balanced 6–8 GHz MMIC Mixer", IEEE MTT Symposium Digest, 1994, Session TV1A-2. The diode ring of this double-balanced mixer comprises four diodes connected side-by-side whose connecting lines form an asymmetric figure 8. The respective balancing circuit portions for the RF signal and for the local oscillator signal comprise two conductor lines coupled with each other, between which concentrated capacitances are provided from amplification of the coupling. Its design is made difficult because of the use of concentrated capacitances, especially when exact electrical properties are desired at very high frequencies (30 GHz). The conductor branch for the intermediate frequency signal is purely capacitatively loaded, whereby troublesome resonances can arise in certain cases.

SUMMARY OF THE INVENTION

It is an object of the present invention to provide a double-balanced mixer of the above-described type, in which the inputs for the local oscillator signal and for the RF signal are decoupled from each other as much as possible and conversion losses are minimized.

This object and others which will be made more apparent hereinafter are attained in a double-balanced mixer comprising a diode ring, respective balancing circuit portions for a local oscillator signal and for a high frequency signal connected with the diode ring and a capacitively-loaded conductor branch for an intermediate frequency signal connected with the diode ring.

According to the invention each balancing circuit portion has a first coupler comprising two strip lines and a second coupler comprising an interdigital coupler. Each first coupler is connected to a respective first symmetric input of the diode ring and each second coupler is connected to a respective second symmetric input of the diode ring. The first and second couplers of each balancing circuit portion are connected with each other via their gates and two other gates of the first couplers form respective asymmetric signal inputs for the local oscillator signal and the high frequency signal respectively.

It is comparatively easy to design a balancing circuit portion comprising planar conductors so that exact electrical properties are obtained. Also both balancing circuit portions assembled from two coupling devices are suitable for obtaining a high isolation between the local oscillator signal and the high frequency signal.

According to a preferred embodiment of the invention the interdigital coupler comprises at least four strip lines extending beside each other, of which two non-neighboring strip lines are connected with each other at one end. The balancing circuit portions are constructed preferably so that each first coupler has a first gate connected with the first symmetric input of the diode ring, a second gate connected to ground, a third gate forming one input for the local oscillator signal or the high frequency signal and a fourth gate connected with the second coupler. Each second coupler has a first gate connected with the second symmetric input of the diode ring, a second gate connected to ground, a third gate not connected or open and a fourth gate connected with the fourth gate of the first coupler.

Preferably inductively-acting conductor sections and capacitors bridging both inputs are connected between the symmetric inputs of the diode ring for the local oscillator signal and the connecting gates for the balancing circuit portion for the local oscillator signal. Also respective capacitors are connected in another preferred embodiment between the symmetric inputs of the diode ring for the high frequency signal and the connecting gates of the balancing circuit portion for the high frequency signal.

The diode ring advantageously comprises four diodes, which are arranged beside each other. The connecting lines between the diodes are arranged in the form of an asymmetric numeral "8" and the conductors are connected and dimensioned so that the diodes are tuned opposite to each other. This is a very compact arrangement, which guarantees a good separation between the local oscillator signal and the high frequency signal.

The conductor branch for the intermediate frequency signal connection comprises preferably two coupled conductors of length $\lambda/4$, which are connected to the diode ring with the respective connectors for the high frequency signal. Each conductor is connected via an RC circuit portion to ground, whereby undesired resonances are suppressed.

BRIEF DESCRIPTION OF THE DRAWING

The objects, features and advantages of the invention will now be illustrated in more detail with the aid of the following description of the preferred embodiments, with reference to the accompanying sole figure which is a schematic circuit diagram of an embodiment of the double-balanced mixer according to the invention.

DESCRIPTION OF THE PREFERRED EMBODIMENTS

The embodiment of the double-balanced mixer shown in the drawing is a planar monolithic double-balanced mixer in which the planar conductors are represented as simple lines. Of course the conductors have a certain predetermined width and length in reality, which depends on the desired transmission characteristics. The exact dimensioning of all conductors should not be described here in detail since it is based on design methods well known to one skilled in the electronics arts.

The double-balanced mixer contains a diode ring, which comprises e.g. the four diodes D1, D2, D3 and D4 shown in the embodiment described here. In order to provide a compact structure, the connecting lines V1, V2, V3, V4, V5, V6, V7, V8 are laid between the individual diodes D1, D2, D3 and D4 to form a component in the form of an asymmetrical numeral "8". The connecting lines between the diodes D1, D2, D2 and D4 and the symmetric inputs 1, 2, 3 and 4 are connected and dimensioned so that the diodes are tuned opposite to each other so that there is an optimum decoupling of the local oscillator signal LO applied to the inputs 1 and 2 and the high frequency signal RF applied to the symmetric inputs 3 and 4.

Since the inputs 1,2 and 3,4 of the diode ring for the local oscillator signal LO and the high frequency signal RF are symmetric, the local oscillator signal LO and the high frequency signal RF applied to the asymmetric gates 12, 13 and 32,33 are fed via respective balancing circuit portions to the diode ring. The balancing circuit portion for the local oscillator signal LO comprises a first coupler formed from two conductors L11 and L12 and a second coupler formed as an interdigital coupler. The interdigital coupler comprises four conductors L21, L22, L23 and L24 arranged side-by-side, of which two non-neighboring connectors L21, L22 are connected at one end and the two other non-neighboring connectors are connected with each other at both ends. This form of an interdigital coupler is also called a "Lange coupler".

The first coupler is connected to the first symmetric input 1 of the diode ring with a first gate 11 on a first conductor L11. The second gate 12 on the first conductor L11 is connected to ground. The local oscillator signal LO is applied across the second gate 12 on the first conductor and the third gate 13 on a second conductor L12. The fourth gate 14 on the second conductor L12 of the first coupler is connected with the gate 24 of the second coupler.

A first gate 21 of the first conductor L21 of the second coupler is connected to the second symmetric input 2 of the diode ring. The second gate 22 of the second coupler, at which the first conductor L21 and the second conductor L22 are connected with each other, is connected to ground. The third gate 23 on the third conductor L23 is not connected or open. The same is true of the end of the fourth conductor L24 connected with the third conductor L23. The connection between the conductors L23 and L24 forms the fourth gate 24, which is connected with the fourth gate 14 of the first coupler. The conductors L11 and L12 of the first coupler coupled with each other and L21, L22, L23, L24 have a length of $\lambda/4$ (a quarter wavelength) of the local oscillator signal LO.

Conductor sections LI and L2 are connected between the gates L11 and L21 of the balancing circuit portion and the symmetric inputs 1 and 2 of the diode ring. Also both gates 11 and 21 are bridged with a capacitor C. The inductive-acting conductor sections L1, L2 and the capacitor C provide a good matching of the balancing circuit portion to the gates 1 and 2 of the diode ring.

The balancing circuit portion for the high frequency signal RF has similar structure to the balancing circuit portion for the local oscillator signal LO. A first coupler, comprising two conductors L31 and L32, is connected with its first gate 31 to the symmetric input 3 of the diode ring and with its gate 32 to ground. The high frequency signal RF is applied across the third gate 33 and the second gate 32 of the first coupler. The fourth gate 34 of the first coupler is connected with the fourth gate 44 of the second coupler constructed as interdigital coupler. The interdigital coupler comprises four conductors L41, L42, L43 and L44 arranged side-by-side. Two non-neighboring conductors L41, L42 are connected at one end and the other non-neighboring conductors L43 and L44, at both ends. The first gate 41 on the conductor L41 is connected to the symmetric input 4 of the diode ring. The conductor L44 connected with the conductor L43 is not connected or open at its free end. The branch point of both conductors L41 and L42 forms the second gate 42, which is grounded. The third gate 43 of the other conductors L43 and L44 is not connected or open at the conductor L43. The fourth gate 44, which connects with the fourth gate 34 of the first coupler, is located at the branch point of both conductors L43 and L44. The conductors L31 and L32 of the first coupler coupled with each other and the conductors L41, L42, L43 and L44 of the second coupler are $\lambda/4$ long. The $\lambda$ represents the average wavelength of the high frequency signal RF.

Respective capacitors C1, C2 for the balancing circuit portion for the high frequency signal RF are connected between connecting gate 41 for the second coupler and its second symmetric input 4 of the diode ring and connecting gate 31 for the first coupler and its first symmetric input 3 of the diode ring. Both capacitors C1 and C2 produce a bandpass for the high frequency signal RF and the local oscillator signal LO and block the intermediate frequency ZF. Also they form a direct current barrier for the case in which the diode ring should be provided with an external direct voltage supply.

The intermediate frequency signal IF is fed to the symmetric inputs 3 and 4 of the diode ring via a conductor branch. The conductor branch comprises two connected conductors L3 and L4 having a length equal to $\lambda/4$ ($\lambda$ corresponding to the wavelength for the intermediate frequency). The conductors L3, L4 are connected between the respective symmetric inputs 3, 4 of the diode ring for the high frequency signal and the respective capacitors C1, C2. Each of the conductors L3,L4 is connected to ground via a respective RC circuit portion, R3,C3; R4,C4 in the vicinity of the branch point. Interfering or troublesome resonances are suppressed by means of grounding the conductors L3 and L4 via respective series circuits each comprising a resistance R3, R4 and a capacitor C3, C4.

The described double-balanced mixer can be operated both as a downwards mixer and as an upwards mixer. As a downwards mixer the high frequency signal RF is supplied besides the local oscillator signal LO and the intermediate frequency signal is taken off. As a upwards mixer the intermediate frequency signal IF is supplied besides the local oscillator signal LO and the high frequency signal RF is taken off.

The disclosure in German Patent Application 198 39 890.5-35 of Sep. 2, 1998 is incorporated here by reference. This German Patent Application, describes the invention described hereinabove and claimed in the claims appended hereinbelow and provides the basis for a claim of priority for the instant invention under 35 U.S.C. 119.

While the invention has been illustrated and described as embodied in a double-balanced mixer, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

What is claimed is:

1. A double-balanced mixer comprising: a diode ring with first symmetric inputs (1,3) and second symmetric inputs (2,4), respective balancing circuit portions for a local oscillator signal and for a high frequency signal, each of said balancing circuit portions comprising a first coupler and a second coupler, and a capacitively-loaded conductor branch for an intermediate frequency signal (IF) connected with the diode ring;

wherein each of said first couplers comprises two strip lines (L11,L12; L31,32) and a plurality of gates (12, 13,14; 32,33,34) and each of said second couplers comprises an interdigital coupler and at least one gate (24,44);

wherein each of said first couplers is connected to a respective one of said first symmetric inputs (1,3) of the diode ring and each of said second couplers is connected to a respective one of said second symmetric inputs (2,4) of the diode ring; and wherein a pair (12,13; 32,33) of said gates of each of said first couplers forms an asymmetric signal input for the local oscillator signal or the high frequency signal and in said respective balancing circuit portions another (14,34) of said gates of said first coupler is connected with said at least one gate (24,44) of said second coupler.

2. The double-balanced mixer as defined in claim 1, wherein the interdigital coupler comprises at least four strip lines (L21, L22, L23, L24; L41, L42, L43, L44) extending side-by-side, of which two non-neighboring strip lines are connected at one end thereof with each other.

3. The double-balanced mixer as defined in claim 1, further comprising respective inductive-acting conductor sections (L1, L2) and a capacitor (C) for said balancing circuit portion for said local oscillator signal (LO), and wherein the first and second couplers of said balancing circuit portion for said local oscillator signal (LO) include two connecting gates (11,21) respectively connected with said first and second symmetric inputs (1,2) for said balancing circuit portion for said local oscillator signal (LO) by means of said respective inductive-acting conductor sections (L1,L2) and said capacitor (C) is connected to said first and said second symmetric inputs (1,2) for said balancing circuit portion for said local oscillator signal (LO) to bridge said first and second symmetric inputs (1,2).

4. The double-balanced mixer as defined in claim 1, further comprising respective capacitors (C1, C2) for said first and second couplers of said balancing circuit portion for said high frequency signal (RF), and wherein the first and second couplers of said balancing circuit portion for said high frequency signal (RF) include respective connecting gates (31,41) and said respective connecting gates (31,41) are connected with said first and second symmetric inputs (3,4) for said balancing circuit portion for said high frequency signal (RF) by means of said respective capacitors (C1, C2).

5. The double-balanced mixer as defined in claim 1, wherein said diode ring comprises four diodes (D1, D2, D3, D4) arranged side-by-side and connecting lines (V1, V2, V3, V4, V5, V6, V7, V8) connecting said four diodes, said connecting lines between said four diodes form an element in the shape of an asymmetric numeral eight, and the connecting lines are connected with the diodes and dimensioned so that the diodes are tuned opposite to each other.

6. The double-balanced mixer as defined in claim 1, wherein the conductor branch for the intermediate frequency signal (IF) comprises respective RC circuit portions (R3,C3; R4,C4) and respective connected conductors (L3, L4); each of said connected conductors (L3,L4) has a length equal to one quarter of a wavelength for the intermediate frequency signal; the first and second symmetric inputs (3,4) of the diode ring for the high frequency signal (RF) are connected with the respective connected conductors (L3, L4) and the respective conductors (L3,L4) are connected to ground via the respective RC circuit portions (R3,C3; R4,C4).

7. A double-balanced mixer comprising: a diode ring with first symmetric inputs (1,3) and second symmetric inputs (2,4), respective balancing circuit portions for a local oscillator signal and for a high frequency signal, each of said balancing circuit portions comprising a first coupler and a second coupler, and a capacitively-loaded conductor branch for an intermediate frequency signal (IF) connected with the diode ring;

wherein each of said first couplers comprises two strip lines (L11 ,L12; L31,32) and a first gate (11,31), a second gate (12,32), a third gate (13,33) and a fourth gate (14,34) and each of said second couplers comprises an interdigital coupler and a first gate (21,41), a second gate (22,42), a third gate (23,43) and a fourth gate (24,44);

wherein said first gates (11,31) of said first couplers are connected to said first symmetric inputs (1,3) respectively; said first gates (21,41) of said second couplers are connected to said second symmetric inputs (2,4) respectively; said second gates (12,32;22,42) of said first and second couplers are grounded; said third gates (23,43) of said second couplers are unconnected or open; said second and third gates (12,13; 32,33) of each of said first couplers forms an asymmetric signal input for the local oscillator signal or the high frequency signal and in said respective balancing circuit portions said fourth gate (14,34) of said first coupler is connected with said fourth gate (24,44) of said second coupler.

8. The double-balanced mixer as defined in claim 7, wherein the interdigital coupler comprises four strip lines (L21, L22, L23, L24; L41, L42, L43, L44) extending side-by-side and two non-neighboring ones of said strip lines are connected at one end thereof with each other.

9. The double-balanced mixer as defined in claim 7, further comprising respective inductive-acting conductor sections (L1, L2) and a capacitor (C) for said balancing circuit portion for said local oscillator signal (LO), and wherein the first and second couplers of said balancing circuit portion for said local oscillator signal (LO) include two connecting gates (11,21) respectively connected with said first and second symmetric inputs (1,2) for said balancing circuit portion for said local oscillator signal (LO) by means of said respective inductive-acting conductor sections (L1,L2) and said capacitor (C) is connected to said first and said second symmetric inputs (1,2) for said balancing circuit portion for said local oscillator signal (LO) to bridge said first and second symmetric inputs (1,2).

10. The double-balanced mixer as defined in claim 7, further comprising two capacitors (C1, C2) for said first and second couplers of said balancing circuit portion for said high frequency signal (RF), and wherein the first and second couplers of said balancing circuit portion for said high frequency signal (RF) include two connecting gates (31,41) and said two connecting gates (31,41) are respectively connected with said first and second symmetric inputs (3,4) for said balancing circuit portion for said high frequency signal (RF) by means of respective ones of said two capacitors (C1, C2).

11. The double-balanced mixer as defined in claim 7, wherein said diode ring comprises four diodes (D1, D2, D3, D4) arranged side-by-side and connecting lines (V1, V2, V3, V4, V5, V6, V7, V8) connecting said four diodes, said connecting lines between said four diodes form a component in the shape of an asymmetric numeral eight, and the connecting lines are connected with the diodes and dimensioned so that the diodes are tuned opposite to each other.

12. The double-balanced mixer as defined in claim 7, wherein the conductor branch for the intermediate frequency signal (IF) comprises respective RC circuit portions (R3,C3; R4,C4) and two connected conductors (L3, L4); each of said connected conductors (L3,L4) has a length equal to one quarter of a wavelength for the intermediate frequency signal; the first and second symmetric inputs (3,4) of the diode ring for the high frequency signal (RF) are respectively connected with the two connected conductors (L3, L4) and the respective conductors (L3,L4) are connected to ground via the respective RC circuit portions (R3,C3; R4,C4).

* * * * *